United States Patent [19]
Skinner

[11] 4,039,966
[45] Aug. 2, 1977

[54] PHASE-LOCK LOOP CIRCUIT

[75] Inventor: Mitchell Allen Skinner, Seabrook, N.H.

[73] Assignee: Bell Telephone Laboratories, Incorporated, Murray Hill, N.J.

[21] Appl. No.: 673,130

[22] Filed: Apr. 2, 1976

[51] Int. Cl.² .............................................. H03B 3/04
[52] U.S. Cl. ........................................... 331/4; 331/17
[58] Field of Search .................. 331/4, 17, 1, 1 A, 25

[56] References Cited
U.S. PATENT DOCUMENTS

| | | | |
|---|---|---|---|
| 2,972,720 | 2/1961 | Hume | 331/4 |
| 3,775,695 | 11/1973 | Hill | 331/4 |
| 3,793,594 | 2/1974 | Griswold | 331/4 |
| 3,886,455 | 5/1975 | Jonckheere | 331/4 |
| 3,935,541 | 1/1976 | Amend et al. | 331/4 |

*Primary Examiner*—John Kominski
*Attorney, Agent, or Firm*—Bryan W. Sheffield

[57] ABSTRACT

A conventional phase-lock loop circuit is modified for use at microwave frequencies. The modification includes a low-frequency oscillator connected in the phase-lock loop to sweep the voltage-controlled oscillator through the frequency of the incoming signal thereby ensuring that lock-in is achieved. The oscillator is automatically turned off when "lock-in" is achieved, thereby reducing residual phase error.

2 Claims, 3 Drawing Figures

PHASE-LOCK LOOP CIRCUIT

BACKGROUND OF THE INVENTION

1. Field of the Invention

Broadly speaking, this invention relates to a phase-lock loop circuit. More particularly, in a preferred embodiment, this invention relates to a phase-lock loop circuit for use at microwave frequencies.

2. Discussion of the Prior Art

The phase-lock loop circuit is widely used in industry. For example, it may be used as an FM demodulator, a carrier recovery circuit for the synchronous demodulation of digitally-encoded signals and for pilot-tone recovery in suppressed-carrier, single-sideband transmission systems, or the like.

The classic phase-lock loop circuit comprises a phase-detector which compares an incoming signal with the output of a voltage-controlled oscillator (VCO). If there is a difference in frequency, and hence phase, between the input signal and the VCO output an error signal is developed which may be used to alter the frequency of the VCO until its output frequency matches the frequency of the input signal, at which time the error signal vanishes and phase-lock is achieved.

A problem arises, however, when an attempt is made to use the classic phase-lock circuit at microwave frequencies. This is so because the time delay around the phase-lock loop, insignificant at lower frequencies, becomes critical and reduces the pull-in range of the PLL circuit to practically zero at microwave frequencies; thus, phase-lock is never achieved. This problem is further compounded if it is desired to use the PLL circuit with digital transmission systems of the type which employ four-phase, DPSK modulation, for example, the 274 Mb/s, 18 GHz microwave system known in the industry as DR-18A. This latter problem is due to the fact that the beat frequency present at the output of the phase detector, ordinarily merely the algebraic difference between the frequency of the input signal and the frequency of the VCO output, becomes, in a four-phase, DPSK system, four times the beat frequency, thus doubly ensuring that phase-lock will never be achieved.

Although certain specialized phase-lock loop circuits, such as the quad-lock detector or the FM discriminator my, in theory, be used in such microwave systems, they do not meet other objectives, such as system noise, and are thus not practical.

SUMMARY OF THE INVENTION

As a solution to these and other problems, the instant invention comprises a phase-lock loop circuit which is modified by the inclusion of a low-frequency oscillator which sweeps the VCO frequency to acquire lock. This oscillator is connected across the low-pass filter employed in the feedback loop in such a manner that the oscillator receives positive feedback only through the loop filter. Thus, the oscillator automatically stops oscillating once phase-lock is achieved, thereby eliminating any residual phase-error which might otherwise be introduced into the circuitry.

The invention, and its mode of operation, will be more fully understood from the following detailed description, when taken with the accompanying drawing in which:

DETAILED DESCRIPTION OF THE INVENTION

Figure 1:
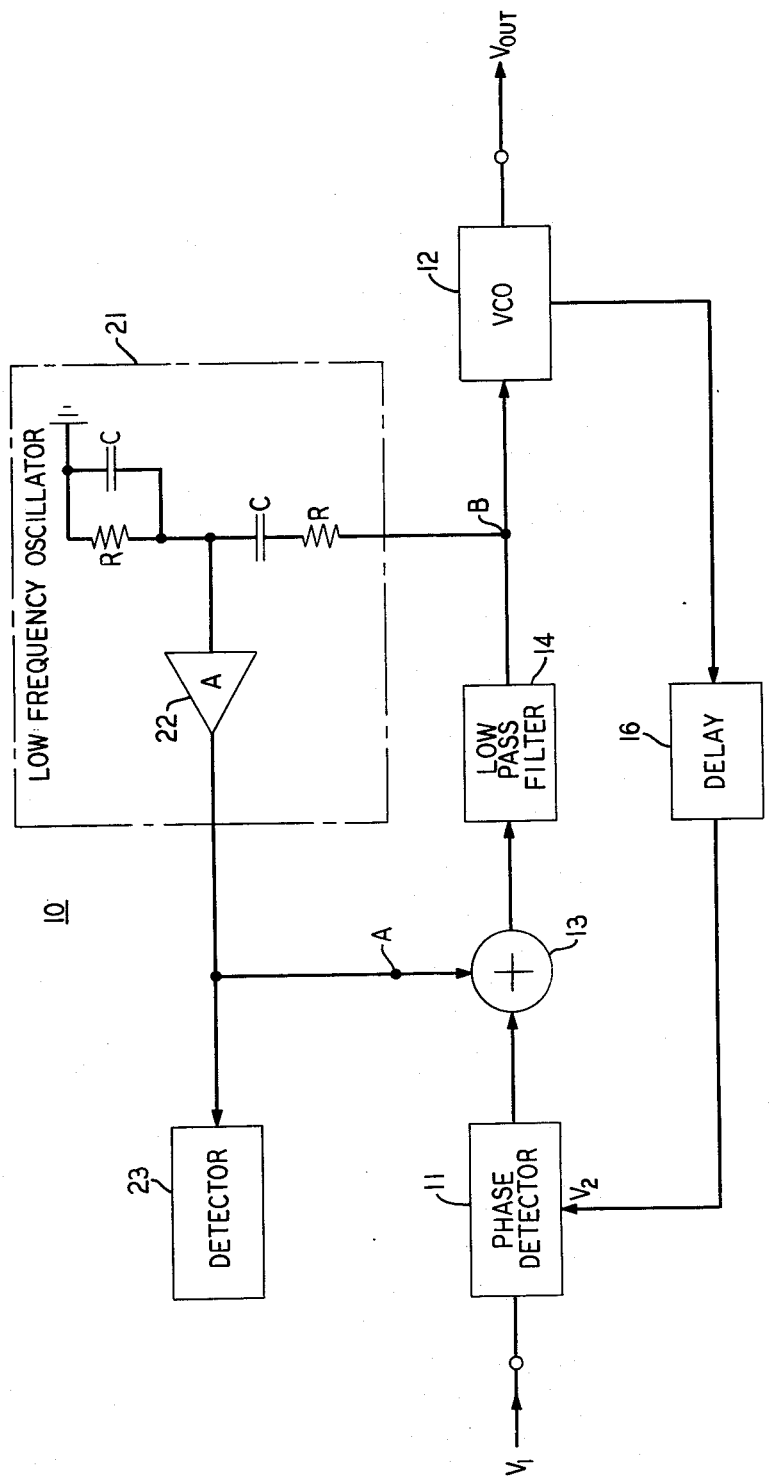
FIG. 1 is a block schematic diagram of an illustrative phase-lock loop circuit according to the invention.

FIG. 1 depicts an illustrative phase-lock loop circuit according to the invention. As previously discussed, the illustrative operating environment for this circuit is the carrier recovery portion of the synchronous demodulator of the DR-18A microwave communications system; thus, the input signal, $V_1$, is at the DR-18A IF frequency of 1.7 GHz. One skilled in the art will appreciate, however, that the invention is not so limited and can function equally well in other operating environments and at other frequencies, which need not necessarily be microwave frequencies.

Returning to FIG. 1 the illustrative phase-lock loop circuit 40 comprises a phase-detector 11 which compares the phase of $V_1$, the input signal, with $V_2$, the output of a voltage-controlled oscillator 12. The control voltage for oscillator 12 comprises the output of phase-detector 11. A low-pass filter 14 is interposed between phase-detector 11 and VCO 12 to limit the bandwidth of the phase-lock loop and thus reduce noise. The delay element 16 which is shown in the feedback path from VCO 12 to the second input of phase-detector 11 represents the distributed circuit delay which is inherent at microwave frequencies and is not intended to represent a discrete circuit element.

A low-frequency, RC oscillator 21, including a fixed-gain, non-linear amplifier 22, is connected to the phase-lock loop by means of an adder 13 such that the feedback path for the oscillator includes low-pass filter 14. A detector circuit 23 is connected to the output of amplifier 22 to detect when oscillator 21 is oscillating.

In operation, assume that the phase-lock loop is out-of-lock and that the free-running output frequency of VCO 12 is very close to the frequency of the input signal $V_1$, say within 5% thereof. Under these circumstances, the beat frequency at the output of phase-detector 11 will be 0.085 GHz (85 MHz) which is vastly higher than the cutoff frequency of low-pass filter 14. Ignoring for the moment the effect of oscillator 21, it will be clear that with such a high beat-frequency, phase-lock loop circuit 10 will never acquire lock. In other words, with respect to signals which are of a frequency low enough to pass through filter 14, the output of phase-detector 11 is virtually zero. With zero output from phase-detector 11 there will, however, be transmission of a feedback signal from the output of oscillator 21 (point A), through low-pass filter 21, into the frequency-sensitive RC network at the input of amplifier 22 (point B).

The gain of amplifier 22 may be set such that oscillations will build-up and stabilize after only a few cycles. These oscillations will occur at a frequency which is given by $f = 1/2\pi RC$, and typically will be 10 Hz or less, i.e., well below the cutoff frequency of filter 14. The low-frequency oscillations present at point A will sweep the VCO output-frequency over some range and the output, of necessity, will pass through the frequency of $V_1$, the input signal, whereupon lock will be acquired.

When the loop is phase-locked, signals introduced at point A will be cancelled by feedback around the phase-lock loop, provided, of course, that the frequency of such feedback signals fall within the loop bandwidth. Since there is now no positive feedback to low-frequency oscillator 21, oscillations will die out rapidly, which fact will be detected by detector 23. From this point on, the phase-lock loop acts as a normal phase-lock loop and, within limits, VCO 12 will track any frequency change in $V_1$, the input signal to phase detector 11.

Proper operation of oscillator 21 requires that the sweep rate be held within certain limits in order that the phase-lock loop can acquire lock when an input signal is present. Further, the phase-lock loop must be able to cancel the sweep signal once lock has been acquired in order to eliminate the positive feedback to the low-frequency oscillator. The analysis that follows provides the design equations required to determine the sweep rate limit and to evaluate the ability of the loop to effectively cancel the positive feedback to the oscillator. Further, an evaluation of the performance of the phase-lock loop in the presence of thermal noise is provided.

Suppose, first, that the input frequency to the phase-lock loop is linearly changing with time at a rate of $\Delta\dot\omega$ rad/sec$^2$. Then, using the linearized model of a phase-lock loop developed by F. M. Gardner, the LaPlace transform of the input phase is given by $$\theta_1(s) = \Delta\dot\omega/S^3 \tag{1}$$

and the associated rate of change of the phase error is $$\lim_{t \to \infty} \frac{d}{dt} \theta_e(+) = \lim_{S \to 0} (S\theta_e(s)) = \frac{\Delta\dot\omega}{K_d K_o A(o)} \text{ rad/sec} \tag{2}$$

where $K_d$ is the phase-detector constant in volts per radian, $K_o$ is the voltage-controlled oscillator sensitivity in rad/sec/volt, and A is the loop filter gain at d.c. Thus, the accumulated phase error after an elapsed time, $t$, is merely $$\frac{\Delta\dot\omega}{K_d K_o A} t. \tag{3}$$

Next, assuming that the gain of the loop filter is infinite, the phase error for a second-order phase-lock loop can be written as $$\theta_e(s) = \frac{S^2 \theta_i(s)}{S^2 + 2S\omega_n S + \omega_n^2} \tag{4}$$

where $\theta_1$ is the input phase, $\omega_n$ is the loop natural frequency, and S is the loop damping factor. Therefore, it is possible to define an acceleration error given by $$\theta_a = \lim_{t \to \infty} \theta_e(+) = \lim_{S \to 0} \frac{\Delta\dot\omega}{S^2 + 2S\omega_n S + \omega_n^2} \tag{5}$$

or $$\theta_a = \frac{\Delta\dot\omega}{\omega_n^2}. \tag{6}$$

For a loop with a sinusoidal phase-detector characteristic the result should be $$\sin \theta_a = (\Delta\dot\omega)_2/\omega_n \tag{7}$$

in which the maximum permissible rate of change of input frequency is $$\Delta\dot\omega = \omega_n^2 \tag{8}$$

For many loops, however, the loop filter gain is finite and, thus, equation 8 represents an overly optimistic bound. Consider instead the case of sinusoidal frequency modulation at the input. Thus, the input phase is given by $$\theta_i(t) = \frac{\Delta\omega}{\omega_m} \cos \omega_m t. \tag{9}$$

For the case of a damping factor of 0.7, the maximum phase error occurs for $W_m = W_n$ and is given by $$\theta_e = 0.7 \frac{\Delta\omega}{\omega_n}. \tag{10}$$

If this phase error were to exceed $\pi/2$, the loop will slip a cycle and thus $$\Delta\omega_{Max} = \omega_n/0.7 \tag{11}$$

This corresponds to a maximum rate of change of input frequency of $$\Delta\dot\omega = 0.7 \omega_n^2 \tag{12}$$

For larger damping factors this rate can be increased somewhat.

Referring again to FIG. 1, for the out-of-lock condition, the phase detector output is essentially zero and, thus, any disturbing signal introduced at point A appears also at point B modified only by the gain of the low-pass filter. When the loop is in-lock, however, feedback around the loop will drastically attenuate the disturbing signal. The amount of attenuation can be determined as follows. First, let the disturbing signal have radian frequency, $W_d$, with a peak amplitude of one volt. Assume next that the signal into the low-pass filter is given by $\alpha \sin (W_d t + \theta)$, where $\alpha$ represents the attenuation factor of the disturber for the in-lock state. Then, using the linear model of the phase-lock loop and calculating the inputs to the summing node at point A yields:

$$\sin \omega_d t - \frac{K_d K_o A(\omega d) \alpha}{\omega_d} \cos(\omega_d t + \theta) = \alpha \sin(\omega_d t + \theta). \tag{13}$$

For most applications $W_d$ will be far below the first break frequency of the low-pass filter. Further, the term on the right will be very small, i.e., a very small error signal, and thus the attenuation factor is given by $$\alpha = \omega/K_dK_oA) \tag{14}$$

This is the desired result in that it permits an evaluation of the change in feedback gain for the low frequency oscillator between the in-lock and out-of-lock conditions. Typical values for $\alpha$ are between $10^{-2}$ and $10^{-4}$. Thus, there is a dramatic change in feedback gain between the locked and unlocked states.

Consider now the effects of thermal noise on the input signal upon the performance of the low-frequency oscillator. It is assumed that the input noise spectrum is flat over a bandwidth $B_i$(Hertz) centered around the input signal. Thus, following the analysis given by F. M. Gardner, the signal-to-noise ratio in the input bandwidth is $$(SNR)_i = \frac{P_s}{P_n} = \frac{1}{2\bar{\theta}_{ni}^2} \tag{15}$$

where $P_s$ is the power in the signal and $P_n$ is the power in the thermal noise. The output phase error in the VCO is modified by the closed loop transfer function of the phase-lock loop and, thus, the mean square output phase error is $$\bar{\theta}_{no}^2 = \int_O^{B_i/2} \Phi |H(j\omega)|^2 df \cong \Phi \int_0^\infty |H(j\omega)|^2 df. \tag{16}$$

The integral in equation 16 is called the "loop noise bandwidth" and for a second-order loop is given by $$B_L = \int_0^\infty |H(j\omega)|^2 df = \frac{\omega_n}{2}(\delta + \frac{1}{4\delta}) Hz. \tag{17}$$

This permits expressing the output phase error as $$\bar{\theta}_{no}^2 = \Phi B_L = \frac{P_n}{P_s} \frac{B_L}{B_i}. \tag{18}$$

Using equation 15 with equation 18 leads to the definition of a loop signal-to-noise ratio, $(SNR)_L$ given by $$(SNR)_L = (SNR)_i \frac{B_i}{2B_L} \tag{19}$$

that the output phase error is $$\bar{\theta}_{no}^2 = \frac{1}{2(SNR)_L}. \tag{20}$$

Next, consider the transfer function of the RC phase-shift network of FIG. 1. The transfer function from the low-pass filter output to the input of the non-linear amplifier 22 is given by $$H(s) = \frac{S/\omega_d}{S^2/\omega_d^2 + 3S/\omega_d + 1} \tag{21}$$

The 3 dB bandwidth of this transfer function is approximately 3 $W_d$. Thus, the positive feedback to the low frequency oscillator occurs in a bandwidth of approximately 3 $W_d$ rad/sec. The signal appearing at point B in FIG. 1 is proportional to frequency and has a bandwidth approximately given by the loop-noise bandwidth and a signal-to-noise ratio given by $(SNR)_L$.

For most applications, the sweep frequency will be much less than the loop-noise bandwidth and, thus, the amount of noise introduced as positive feedback to the low frequency oscillator will be insignificant. Therefore, the oscillator will not begin to sweep until the phase-lock loop has broken lock because of cycle slipping at low input signal-to-noise ratios.

In an experimental DR-18A receiver actually built and tested, the carrier recovery portion of the synchronous demodulator circuit utilized a phase-lock loop substantially identical to that shown in FIG. 1. This circuit had the following parameters:

| | |
|---|---|
| Operating Frequency: | $f_o$ = 1.7 GHz |
| Phase Detector Constant: | $K_d$ = 0.2 volt/radian |
| VCO Sensitivity: | $K_o$ = $2\pi \times 50$ Mrad/sec/volt |
| Noise Bandwidth: | $B_L$ = 3.3 MHz |
| Damping Factor: | $\delta$ = 1 |
| Natural Frequency: | $W_n$ = $5.3 \times 10^{+6}$ rad/sec |
| Sweep Frequency: | $W_d$ = 556 rad/sec |

The maximum permissible sweep rate and the attenuation of the disturber were

| | |
|---|---|
| Maximum Sweep Rate: | $\Delta\omega$ = $1.97 \times 10^{+13}$ rad/sec/sec |
| Attenuation Factor: | $\alpha$ = $10^{-7}$ |

During sweep, the VCO control voltage was approximately a sine wave with a peak amplitude of 1 volt and a frequency of 556 rad/sec. Therefore, the rate of change of the VCO frequency was 556 × 1 volt/sec × $2\pi \times 50$ Mrad/sec = $1.7 \times 10^{+11}$ rad/sec/sec, which is well within the permissible sweep rate.

Figure 2:
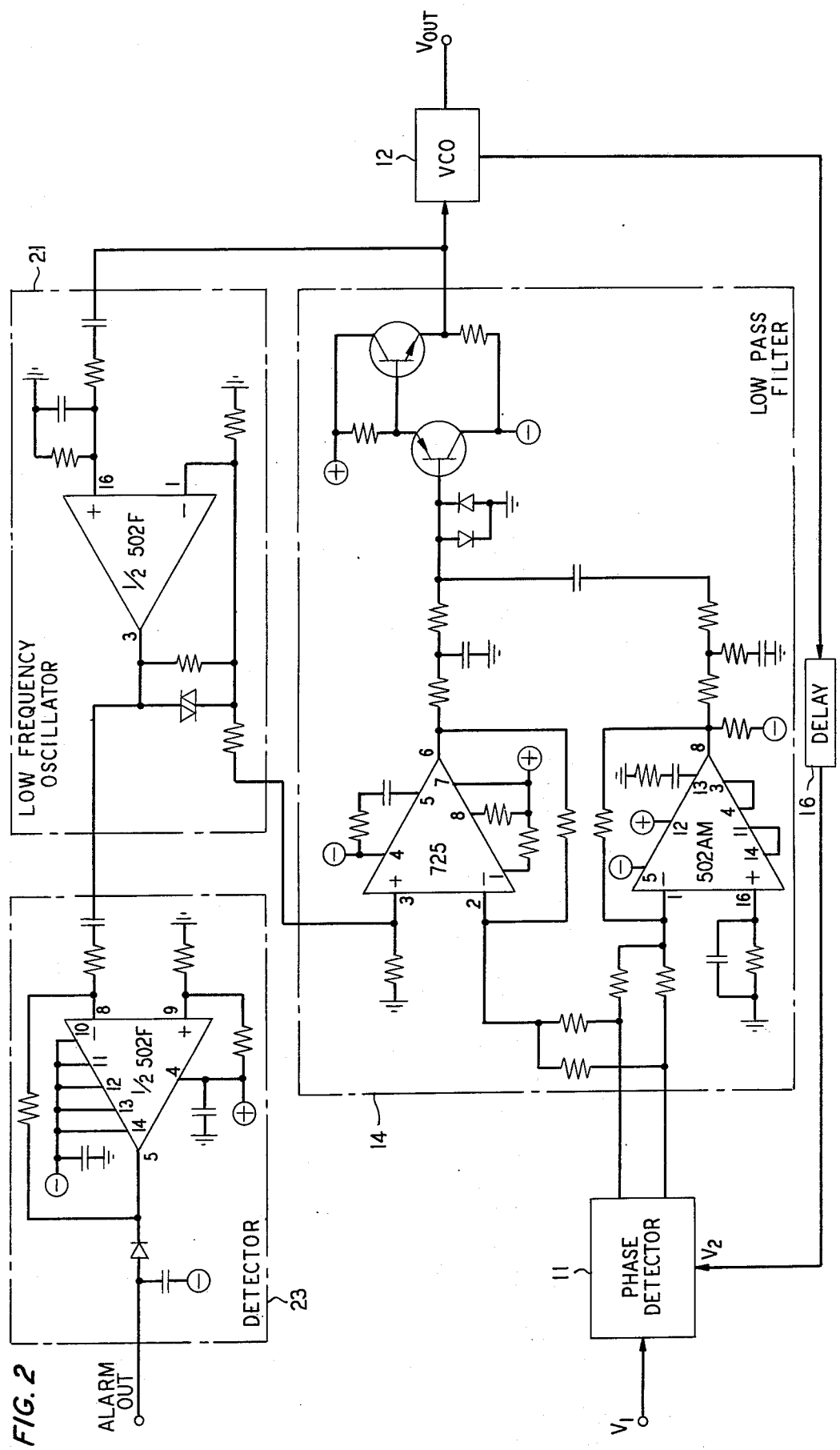
FIG. 2 is a schematic diagram of an illustrative carrier recovery circuit which utilizes the phase-lock loop circuit shown in FIG. 1.

FIG. 2 depicts the specific circuitry employed for the above-discussed illustrative embodiment in the DR-18A system. This circuitry will not be discussed in detail as its operation will be self-evident to one skilled in the art, once the block schematic diagram shown in FIG. 1 is understood. As shown in FIG. 2, a single integrated circuit, a Western Electric code 502 F, provides the operational amplifiers employed in the low frequency oscillator and in the detection circuit employed for phase-lock indication. A Western Electric code 502 AM operational amplifier and μA 725 operational amplifier function as the low-pass filter. No specific circuitry is shown for the phase-detector and voltage control oscillator as these are known per se in the art. See, for example, *Phaselock Techniques* by F. M. Gardner, J. Wiley & Sons, New York, 1966, *Functional Circuits and Oscillators* by H. J. Reich, D. Van Nostrand Company, Inc., Princeton, 1961, and "Diode Phase Detectors" by S. Krishnan, *Electronic and Radio Engineer*, Vol. 36, No. 2, pp. 45-50 (1959), all of which are hereby incorporated by reference.

As previously discussed, with oscillator 21 disabled or disconnected, the pull-in range of the phase-lock loop was found to be only a few megahertz. With oscillator 21 connected, however, the pull-in range was expanded to ±20 MHz which is just about equal to the holding range. Further, when the signal-to-noise ratio at the input to the phase detector was degraded, the loop broke lock at the same level that it would have if oscillator 21 were not present. This fact may be attributed to the narrow bandwidth of the feedback network for oscillator 21, e.g., less than 1 kHz.

In a second embodiment of the invention actually built and tested, the phase-lock loop according to the invention was used for synchronizing an experimental single-sideband terminal operating at a frequency of 16.6 MHz. In this embodiment the phase-lock loop had the following parameters:

| Operating Frequency: | $f_o = 16.608$ MHz |
| Phase Detector Constant: | $K_d = 20$ mVolts/radian |
| VCO Sensitivity: | $K_o = 2\pi \times 10$ KHz/volt |
| Noise Bandwidth: | $B_L = 1178$ Hz |
| Damping Factor: | $\delta = 1$ |
| Natural Frequency: | $W_n = 1885$ rad/sec |
| Sweep Frequency: | $W_d = 74$ rad/sec |

Using equations 12 and 14 the maximum permissible sweep rate and the attenuation of the disturber were found to be

| Maximum Sweep Rate: | $\Delta\omega = 2.5$ Mrad/sec/sec |
| Attenuation Factor: | $a = 3.7 \times 10^{-4}$ |

The actual sweep rate can be determined from the fact that, during sweep, the VCO control voltage is approximately a sine wave with a peak amplitude of 1 volt and a frequency of 74 rad/sec. Therefore, the rate of change of the VCO frequently is 74 volts/sec $\times 2\pi \times 10 k$ rad/sec/volt $= 4.6$ Mrad/sec/sec, which is within the permissible sweep rate.

Figure 3:
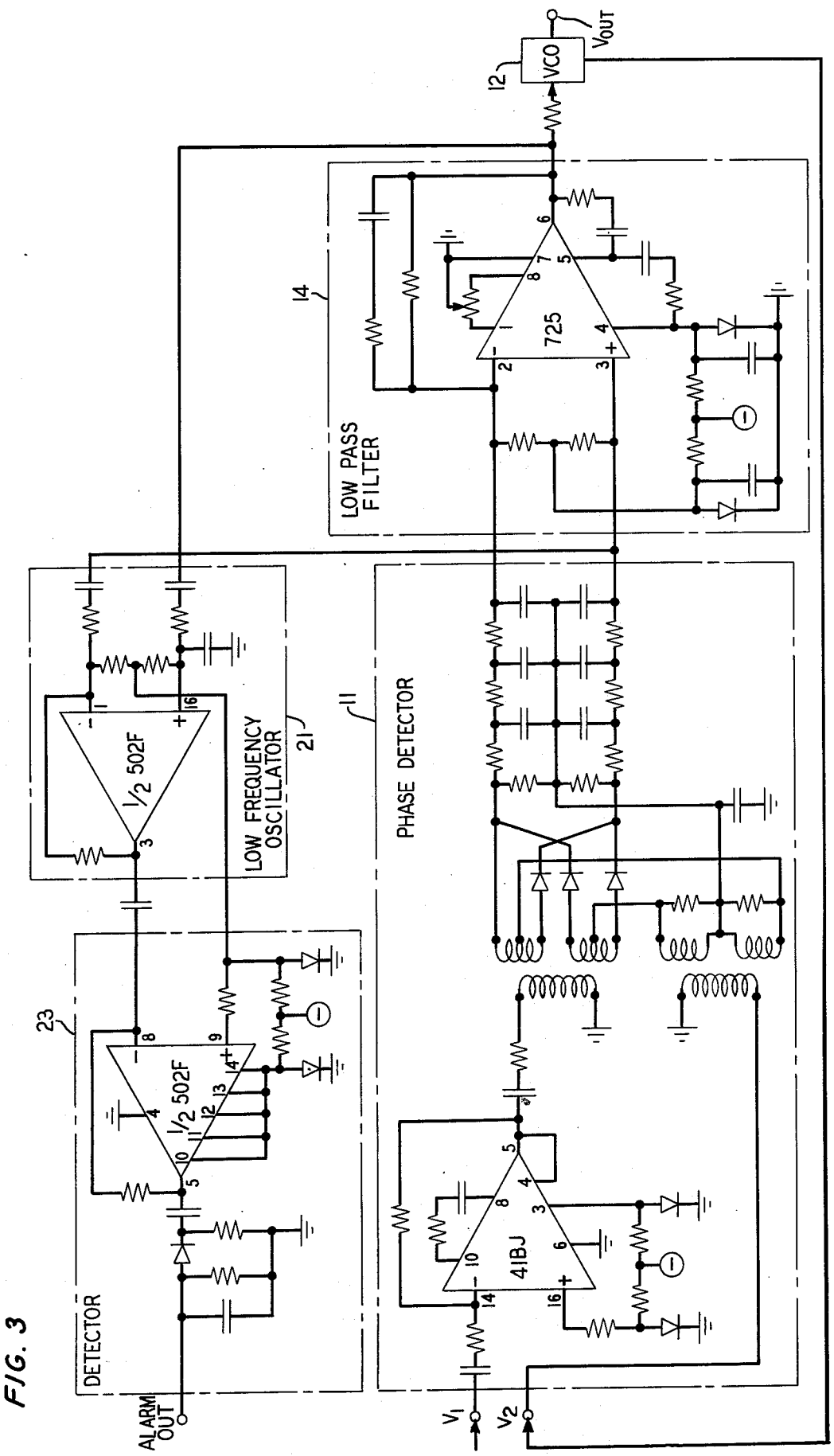
FIG. 3 is a schematic diagram of an illustrative synchronizing circuit which utilizes the phase-lock loop circuit shown in FIG. 1.

FIG. 3, depicts the specific circuitry employed in this illustrative embodiment. Again, this circuitry will not be discussed in detail. A single Western Electric code 502 F integrated circuit provides the operational amplifiers used in the low-frequency oscillator and in the detection circuit used for phase-lock indication. The low frequency oscillator input is added to the phase detector output via the positive input of the low-pass filter which comprises a μA 725 operational amplifier. The phase-detector, shown in detail here, employs a Western Electric type 41BJ operational amplifier.

Among the obvious advantages of the instant invention is the fact that the acquisition method operates automatically, without the use of decision circuits, and that no additional RF circuitry is required. Another advantage is that the output of the low-frequency oscillator may be used to signal a "lock" or "out-of-lock" lock condition, via detector 23.

One skilled in the art may make various changes and substitutions to the layout of parts shown without departing from the spirit and scope of the invention.

What I claim is:

1. A phase-lock loop circuit which comprises:
a voltage-controlled oscillator having at least one output and a control input;
a phase-comparison circuit having first and second inputs and a pair of complementary outputs, an incoming signal being applied to said first input and said at least one output of said voltage-controlled oscillator being applied to said second input; and
an active, low-pass filter interconnecting the complementary outputs of said phase-comparison circuit and the control input of said voltage-controlled oscillator to limit the bandwidth of said phase-lock loop, said filter comprising:
a first operational amplifier having inverting and non-inverting inputs and an output;
a second operational amplifier having inverting and non-inverting inputs and an output, the inverting inputs of said first and second amplifiers being connected to the complementary outputs of said phase detector;
a first amplifier having an output connected to the input of said voltage-controlled oscillator and an input connected to the outputs of said first and second operational amplifiers; and
first and second filter sections respectively interposed between the outputs of said first and second operational amplifiers and the input of said first amplifier, said phase-lock loop further comprising:
a low-frequency oscillator for modulating said voltage-controlled oscillator so that the frequency of the output signal therefrom sweeps through the frequency of said incoming signal whereupon said circuit achieves lock, said low-frequency oscillator including a third operational amplifier having a non-inverting input connected to the control input of said voltage-controlled oscillator, the inverting input and the output thereof being connected to the non-inverting input of said first operational amplifier.

2. A phase-lock loop circuit which comprises:
a voltage-controlled oscillator having at least one output and a control input;
a phase-comparison circuit having first and second inputs and a pair of complementary outputs, an incoming signal being applied to said first input and said at least one output of said voltage-controlled oscillator being applied to said second input; and
an active, low-pass filter interconnecting the complementary outputs of said phase-comparison circuit and the control input of said voltage-controlled oscillator to limit the bandwidth of said phase-lock loop, said filter comprising:
a first operational amplifier having inverting and non-inverting inputs respectively connected to the complementary outputs of said phase detector and an output connected to the control input of said voltage-controlled oscillator; and
at least one frequency shaping network associated with the internal frequency compensating inputs of said operational amplifier, said phase-lock loop circuit further comprising:
a low-frequency oscillator for modulating said voltage-controlled oscillator so that the frequency of the output signal therefrom sweeps through the frequency of said incoming signal whereupon said circuit achieves lock, said oscillator comprising a second operational amplifier having inverting and non-inverting inputs and an output, said inverting input being connected to said output and to the non-inverting input of said first operational amplifier and said non-inverting input being connected to the output of said first operational amplifier.

* * * * *